(12) United States Patent
Choi et al.

(10) Patent No.: US 12,711,365 B2
(45) Date of Patent: Aug. 18, 2026

(54) NEUROMORPHIC DEVICE HAVING THREE-DIMENSIONAL STACKED STRUCTURE AND METHOD OF FABRICATING THE SAME

(71) Applicants: SK hynix Inc., Icheon-si (KR); Korea Advanced Institute of Science and Technology (KAIST), Daejeon (KR)

(72) Inventors: Yang-Kyu Choi, Seoul (KR); Joon-Kyu Han, Seoul (KR)

(73) Assignees: SK hynix Inc., Icheon-si (KR); Korea Advanced Institute of Science and Technology (KAIST), Daejeon (KR)

( * ) Notice: Subject to any disclaimer, the term of this patent is extended or adjusted under 35 U.S.C. 154(b) by 932 days.

(21) Appl. No.: 18/059,861

(22) Filed: Nov. 29, 2022

(65) Prior Publication Data

US 2023/0169317 A1 Jun. 1, 2023

(30) Foreign Application Priority Data

Nov. 30, 2021 (KR) ........................ 10-2021-0169461

(51) Int. Cl.
*G06N 3/06* (2006.01)
*G06N 3/063* (2023.01)
(Continued)

(52) U.S. Cl.
CPC ............. *G06N 3/063* (2013.01); *H10B 41/40* (2023.02); *H10B 43/40* (2023.02);
(Continued)

(58) Field of Classification Search
CPC ........ G06N 3/063; G06N 3/065; H10B 41/40; H10D 30/0411; H10D 30/69;
(Continued)

(56) References Cited

U.S. PATENT DOCUMENTS 9,418,333 B2 * 8/2016 Kim ...................... G11C 11/412
10,891,543 B2 * 1/2021 Hosokawa ............. G06N 3/088
(Continued)

FOREIGN PATENT DOCUMENTS

KR 10-2143440 B1 8/2020
KR 10-2021-0039265 A 4/2021

OTHER PUBLICATIONS

Tang et al., "Ultrashort Channel Silicon Nanowire Transistors with Nickel Silicide Source/Drain Contacts", Jun. 25, 2012, Nano Letters, pp. 3979-3985 (Year: 2012).*
(Continued)

*Primary Examiner* — Paulinho E Smith

(57) ABSTRACT

A neuromorphic devices may be formed having a three-dimensional stacked structure. The neuromorphic device may include a lower device formed on a substrate, an interlayer insulating layer formed on the substrate to cover the lower device, a synapse device having a Schottky barrier transistor structure formed on the interlayer insulating layer, and a vertical connection wiring formed in the interlayer insulating layer to electrically connect the lower device and the synapse device. The synapse device may include a channel, a source having a metal silicide forming a first Schottky junction with the channel, a drain having a metal silicide forming a second Schottky junction with the channel, a floating gate for a synaptic operation, and a control gate. The synapse device may be formed using only low-temperature processes performed at less than about 500 degrees Celsius.

17 Claims, 12 Drawing Sheets

(51) Int. Cl.
*H10B 41/40* (2023.01)
*H10B 43/40* (2023.01)
*H10D 30/01* (2025.01)
*H10D 30/68* (2025.01)
*H10D 30/69* (2025.01)
*H10D 64/64* (2025.01)

(52) U.S. Cl.
CPC ..... *H10D 30/0411* (2025.01); *H10D 30/0415* (2025.01); *H10D 30/683* (2025.01); *H10D 30/69* (2025.01); *H10D 64/647* (2025.01)

(58) Field of Classification Search
CPC ............. H10D 30/683; H10D 30/0415; H10D 64/647; H10D 30/0277; H10D 10/031; H10D 10/051; H10D 10/221; H10D 30/0612; H10D 30/87; H10D 30/871; H10D 64/64
See application file for complete search history.

(56) References Cited

U.S. PATENT DOCUMENTS

| | | | | |
|---|---|---|---|---|
| 11,003,984 | B2 * | 5/2021 | Hosokawa | G06N 3/088 |
| 11,017,286 | B2 * | 5/2021 | Lee | G06N 3/049 |
| 11,055,603 | B2 * | 7/2021 | Park | G06N 3/063 |
| 11,106,971 | B2 * | 8/2021 | Lee | G06N 3/063 |
| 11,233,049 | B2 * | 1/2022 | Chen | G06N 3/065 |
| 2003/0206437 | A1 * | 11/2003 | Diorio | H10D 30/0411 365/185.03 |
| 2015/0088797 | A1 * | 3/2015 | Kim | G06N 3/049 706/29 |
| 2017/0061278 | A1 * | 3/2017 | Lee | G06N 3/049 |
| 2017/0185890 | A1 * | 6/2017 | Yasuda | G06N 3/063 |
| 2017/0193364 | A1 * | 7/2017 | Lee | G06N 3/063 |
| 2018/0181856 | A1 * | 6/2018 | Lee | G06N 3/063 |
| 2018/0225566 | A1 * | 8/2018 | Lee | G06N 3/049 |
| 2018/0240846 | A1 * | 8/2018 | Choi | G06N 3/065 |
| 2018/0269229 | A1 * | 9/2018 | Or-Bach | H10D 84/907 |
| 2018/0285721 | A1 * | 10/2018 | Lee | G06N 3/065 |
| 2018/0349762 | A1 * | 12/2018 | Lee | G06N 3/063 |
| 2019/0294958 | A1 * | 9/2019 | Kim | G06N 3/08 |
| 2020/0218963 | A1 * | 7/2020 | Yasuda | G06N 3/048 |
| 2022/0138546 | A1 * | 5/2022 | Kwak | G11C 11/1653 706/33 |
| 2022/0149200 | A1 * | 5/2022 | Park | G06N 3/065 |
| 2022/0366227 | A1 * | 11/2022 | Lee | G06N 3/065 |
| 2023/0013047 | A1 * | 1/2023 | Chou | H10D 30/0413 |
| 2023/0169317 | A1 * | 6/2023 | Choi | H10D 30/69 706/26 |

OTHER PUBLICATIONS

Zer-Ming Lin et al., "Characteristics of n-Type Asymmetric Schottky-Barrier Transistors with Silicided Schottky-Barrier Source and Heavily n-Type Doped Channel and Drain", 2012, Japanese Journal of Applied Physics, vol. 51, pp. 1-7 (Year: 2012).*

Han et al., "A Vertical Silicon Nanowire Based Single Transistor Neuron with Excitatory, Inhibitory, and Myelination Functions for Highly Scalable Neuromorphic Hardware", 2021, Advanced Science News, pp. 1-9. (Year: 2021).*

Choi et al., "3-D Synapse Array Architecture Based on Charge-Trap Flash Memory for Neuromorphic Application", Dec. 30, 2019, Electronics 2020, vol. 9, pp. 1-10 (Year: 2019).*

* cited by examiner

< HEAT TREATMENT >

NEUROMORPHIC DEVICE HAVING THREE-DIMENSIONAL STACKED STRUCTURE AND METHOD OF FABRICATING THE SAME

CROSS-REFERENCES TO RELATED APPLICATION

The present application claims, under 35 U.S.C. § 119(a), the benefit of Korean application No. 10-2021-0169461 filed on Nov. 30, 2021, which is herein incorporated by reference in its entirety.

BACKGROUND OF THE INVENTION

1. Field

The present invention relates to an electronic device, an apparatus including the same, and fabricating methods thereof, and more particularly, to an electronic synapse device, a neuromorphic device including the same, and fabricating methods thereof.

2. Description of the Related Art

As the scale reduction of transistors is reaching its limit, neuromorphic computing systems are receiving attention as a concept which may overcome the limitations of a computer system according to the existing von Neumann technology.

Neuromorphic computing implements artificial intelligence behavior by mimicking the human brain using hardware. The human brain performs very complex functions, but consumes only about 20 W of energy. However, when the brain operation is implemented in hardware using von Neumann technology, the effectiveness is low in terms of power or capacity. In contrast, neuromorphic computing may imitate the structure of the human brain itself and perform, with low power consumption, artificial intelligence operations of association, reasoning, and recognition that are superior to the existing von Neumann method computing.

A neuromorphic system for providing neuromorphic computing is composed of numerous neuron devices and synapse devices, similar to the human brain, and includes additional circuits for signal processing and transmission. Each synapse device stores a respective connection weight according to the correlation of a spike expressed by the neuron devices, and in some cases, controls the connection weight through reinforcement/potentiation and/or suppression/depression process. In a synapse device, the connection weight (connection strength) of a synapse may be expressed as electrical conductivity (conductance). Resistive random access memory (RRAM)-based and memristor-based devices have been extensively studied for use as a synapse device, but these devices have disadvantages regarding reliability and process compatibility with complementary metal oxide semiconductor (CMOS) technologies. Accordingly, recently, a MOSFET (metal-oxide-semiconductor field-effect transistor)-based synapse device has been actively studied for use as a synapse device.

Numerous synapse devices constituting the neuromorphic system may be complexly connected to a neuron device which is another component, and an additional circuit, for parallel operation. Therefore, because of the repeated movement of data and signals in the interconnector for such a connection, power consumption and signal delay occur, which causes various disadvantages and limitations in terms of power and speed of the neuromorphic system. To solve this problem, improvements in the power consumption and signal delay incurred by the interconnector of the neuromorphic system are required.

SUMMARY OF THE INVENTION

A technical object to be achieved by embodiments disclosed herein is to provide a neuromorphic device having improved degree of integration, power efficiency, and speed by minimizing power consumption and signal delay occurring in the interconnector between a synapse device, a neuron device, and an additional circuit.

In addition, another technical object to be achieved by embodiments disclosed herein is a neuromorphic system having the above-described advantages.

In addition, another technical object to be achieved by embodiments disclosed herein is to provide a neuromorphic device capable of three-dimensional integration and having improved performance by implementing a synapse device as a device which does not require an ion implantation process and a high-temperature heat treatment (e.g., annealing) process.

In addition, another technical object to be achieved by embodiments disclosed herein is a method of fabricating the above-described neuromorphic device.

The problems to be solved by the embodiments disclosed herein are not limited to the problems mentioned above, and other problems not mentioned will be understood by those skilled in the art from the following description.

According to an embodiment of the present disclosure, there is provided a neuromorphic device having a three-dimensional stacked structure, the neuromorphic device comprising: a lower device formed on a substrate; an interlayer insulating layer formed on the substrate to cover the lower device; a synapse device having a Schottky barrier transistor structure, which is formed on the interlayer insulating layer and includes a channel, a source/drain having a metal silicide forming a Schottky junction with the channel, a floating gate for a synaptic operation, and a control gate; and a vertical connection wiring formed in the interlayer insulating layer to electrically connect the lower device and the synapse device.

The source/drain of the synapse device may be a member formed through a low temperature process of less than about 500° C.

The source/drain of the synapse device may include any silicide of at least one selected from tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir).

The channel of the synapse device may include silicon (Si).

The synapse device may further include a first insulating layer disposed between the channel and the floating gate and a second insulating layer disposed between the floating gate and the control gate.

At least one of the first and second insulating layers may include at least one of a silicon oxide, a silicon nitride, a silicon oxynitride, and a high-k material having a higher dielectric constant than that of the silicon nitride.

The floating gate of the synapse device may include at least one of a polycrystalline silicon layer, an amorphous silicon layer, a metal oxide layer, a silicon nitride layer, a silicon nanocrystal layer, a metal nanocrystal layer, a silicon oxide nanocrystal layer, and a metal oxide nanocrystal layer.

The lower device may include at least one of a neuron device and a complementary metal oxide semiconductor (CMOS) device.

The lower device may include a transistor device portion. The transistor device portion may include a channel region, a source region, a drain region, a gate insulating layer, and a gate electrode. The vertical connection wiring may be configured to electrically interconnect the source of the synapse device and the source region of the transistor device portion.

The channel region, the source region, and the drain region of the transistor device portion may include the same semiconductor material.

According to an embodiment, there is provided a method of fabricating a neuromorphic device having a three-dimensional stacked structure, the method comprising: forming a lower device on a substrate; forming an interlayer insulating layer on the substrate to cover the lower device; forming a vertical connection wiring electrically connected to the lower device in the interlayer insulating layer; and forming a synapse device having a Schottky barrier transistor structure, which is electrically connected to the vertical connection wiring on the interlayer insulating layer, and includes a channel, a source/drain having a metal silicide forming a Schottky junction with the channel, a floating gate for a synaptic operation, and a control gate, and wherein the lower device and the synapse device are electrically interconnected by the vertical connection wiring.

The forming of the synapse device may include forming a metal layer covering the control gate while being bonded to both side surfaces of the channel; forming the source/drain by performing a heat treatment process on the metal layer to change portions of the metal layer bonded to the both side surfaces of the channel into the metal silicide; and removing a remaining portion of the metal layer which is not changed into the metal silicide in the heat treatment process.

The heat treatment process may be performed at a temperature of less than about 500° C.

The heat treatment process may be performed by any one of rapid thermal annealing (RTA), furnace annealing, and laser annealing.

The metal layer may include at least one of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir).

Before the forming of the metal layer, the forming of the synapse device may further include forming a channel material layer on the interlayer insulating layer; forming a gate stack including the floating gate and the control gate on the channel material layer; and defining the channel from the channel material layer by etching portions of the channel material layer on both sides of the gate stack.

The lower device may include at least one of a neuron device and a complementary metal oxide semiconductor (CMOS) device.

The lower device may include a transistor device portion. The transistor device portion may include a channel region, a source region, a drain region, a gate insulating layer, and a gate electrode. The vertical connection wiring may be configured to electrically interconnect the source of the synapse device and the source region of the transistor device portion.

The channel region, the source region, and the drain region of the transistor device portion may include the same semiconductor material.

According to embodiments of the present disclosure, unlike the conventional synapse device which requires an ion implantation process and a high temperature heat treatment process of, for example, about 1,000° C. or more, a neuromorphic device including three-dimensional integration may be implemented by using a Schottky barrier transistor which does not require the high temperature heat treatment. As a result, it is possible to minimize the interconnecting length between the synapse device and the neuron device/additional circuit in the neuromorphic device, and it is possible to greatly improve characteristics and performance such as integration degree, power efficiency, and speed.

More specifically, in the case of the Schottky barrier transistor, since the source/drain regions of the MOSFET are formed of a metal-based material rather than a p-n junction, an ion implantation process and a high-temperature heat treatment (annealing) process of 1,000° C. or higher are not required. Therefore, when the synapse device to which the configuration of the Schottky barrier transistor is applied is integrated (stacked) on a predetermined lower device, the lower device may not be deteriorated. As a result, a neuromorphic device having a three-dimensional stacked structure may be easily manufactured. In addition, by using the three-dimensional stacked structure, the interconnecting length between the synaptic element and the neuron element/additional circuit may be minimized, and the degree of integration, power efficiency, and speed of the neuromorphic system may be improved.

However, the effects of embodiments are not limited to the above effects, and may be variously expanded without departing from the spirit and scope of the present disclosure.

DETAILED DESCRIPTION OF THE INVENTION

Figure 1:
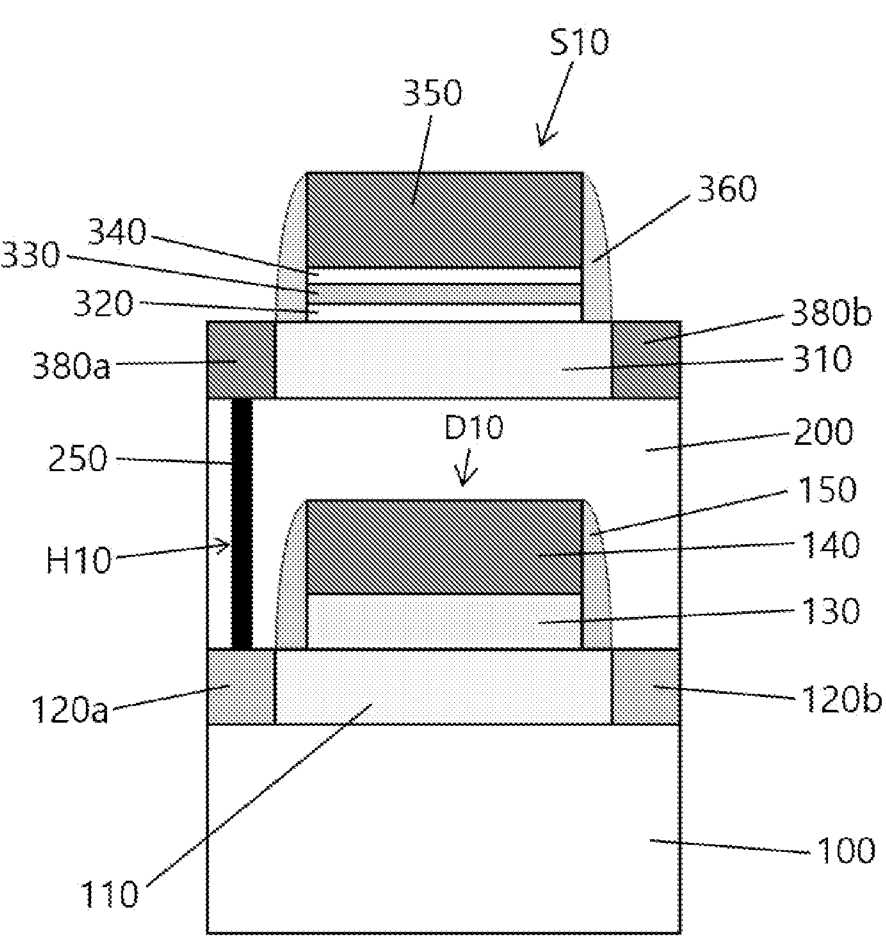
FIG. 1 is a cross-sectional diagram illustrating a neuromorphic device having a three-dimensional stacked structure according to an embodiment of the present disclosure.

Hereinafter, embodiments of the present disclosure will be described in detail with reference to the accompanying drawings.

The embodiments to be described below are provided to more clearly explain the present disclosure to those of ordinary skill in the related art. The scope of the present invention is not limited by the disclosed embodiments, and the disclosed embodiments may be modified in many different forms.

The terminology used herein is used to describe specific embodiments, and is not used to limit the present invention. As used herein, terms in the singular form may include the plural form unless the context clearly dictates otherwise. Also, as used herein, the terms “comprise” and/or “comprising” specifies the presence of the stated shape, step, number, action, member, element and/or group thereof; and does not exclude the presence or addition of one or more other shapes, steps, numbers, actions, members, elements, and/or groups thereof. In addition, the term "connection" as used herein is a concept that includes not only that certain members are directly connected, but also a concept that other members are further interposed between the members to be indirectly connected.

In addition, in the present specification, when a member is said to be located "on" another member, this includes not only a case in which a member is in contact with another member but also a case in which another member is present between the two members. As used herein, the term "and/or" includes any one and any combination of one or more of those listed items. In addition, as used herein, terms such as "about", "substantially", etc. are used as a range of the numerical value or degree, in consideration of inherent fabricating and material tolerances, or as a meaning close to the range. Furthermore, accurate or absolute numbers provided to aid the understanding of the present application are to enable those skilled in the art to make and use the invention and should not necessarily be viewed as limiting.

In the accompanying drawings, the size or thickness of the regions or parts shown in the accompanying drawings may be exaggerated for clarity and convenience of description. The same reference numerals refer to the same elements throughout the detailed description.

FIG. 1 is a cross-sectional diagram illustrating a neuromorphic device having a three-dimensional stacked structure according to an embodiment.

Referring to FIG. 1, the neuromorphic device may include a lower device D10 formed on a substrate 100, an interlayer insulating layer 200 formed on the substrate 100 to cover the lower device D10, a synapse device S10 formed on the interlayer insulating layer 200, and a vertical connection wiring (vertical-type interconnector) 250 formed in the interlayer insulating layer 200 to electrically connect the lower device D10 and the synapse device S10.

The substrate 100 may be a semiconductor substrate. For example, the substrate 100 may include any one of silicon (Si), silicon germanium (SiGe), strained silicon (strained Si), strained silicon germanium (strained SiGe), silicon on insulator (SOI), silicon carbide (SiC), a group 3-5 compound semiconductor, and a group 2-7 compound semiconductor. However, the material of the substrate 100 is not limited to the above descriptions, and various known materials may be used.

The lower device D10 may include a metal oxide semiconductor (MOS) device which is a component of a neuron device. In addition, other components of the neuron device and an additional circuit or a peripheral circuit for signal processing and signal transmission may be formed on the substrate 100 and covered by the interlayer insulating layer 200. FIG. 1 shows a partial configuration of the lower device D10 as an example. The lower device D10 may include a channel region 110, a source region 120*a*, a drain region 120*b*, a gate insulating layer 130, and a gate electrode 140. The channel region 110 may be referred to as a 'first channel'. The source region 120*a* may be referred to as a 'first source'. The drain region 120*b* may be referred to as a 'first drain'.

The channel region 110, the source region 120*a*, and the drain region 120*b* may include the same semiconductor material. For example, the channel region 110, the source region 120*a*, and the drain region 120*b* may include silicon (Si), silicon germanium (SiGe), strained silicon, strained silicon germanium (strained SiGe), silicon carbide (SiC) or a group 3-5 compound semiconductor. In the source region 120*a* and the drain region 120*b*, a conductive impurity or a reaction product such as a silicide material for improving junction resistance or forming an ohmic contact may be included.

Additionally, a sidewall insulating layer 150 may be disposed on both side surfaces of a stack comprising the gate insulating layer 130 and the gate electrode 140. The sidewall insulating layer 150 may include, for example, at least one selected from a group comprising silicon oxide, silicon nitride, silicon oxynitride, and other insulating materials. The sidewall insulating layer 150 may be referred to as a spacer (a first spacer).

The interlayer insulating layer 200 is a layer for electrically separating the lower device D10 and the synapse device S10, and may include, for example, at least one selected from a group consisting of silicon oxide, silicon nitride, silicon oxynitride, and an insulating polymer. However, the material of the interlayer insulating layer 200 is not limited to the above descriptions, and may be variously changed.

The synapse device S10 may have a structure of a Schottky barrier transistor. More specifically, the synapse device S10 may include a channel 310, a source 380*a*, and a drain 380*b*, wherein the source 380*a* and drain 380*b* each contain a metal silicide to form a respective Schottky junction together with the channel 310. The synapse device S10 may further include a floating gate 330 for a synaptic operation (i.e., a synapse operation), a control gate 350, a first insulating layer 320 disposed between the channel 310 and the floating gate 330, and a second insulating layer 340 disposed between the floating gate 330 and the control gate 350. The first insulating layer 320 may be referred to as a first gate insulating layer, and the second insulating layer 340 may be referred to as a second gate insulating layer. Also, the first insulating layer 320 may be a tunnel insulating layer, and the second insulating layer 340 may be a blocking insulating layer. In an embodiment, the synapse device S10 may further include a spacer insulating layer 180 disposed on both side surfaces of a stack including the first insulating layer 320, the floating gate 330, the second insulating layer 340, and the control gate 350.

The channel 310 may include, for example, silicon (Si). The channel 310 may include monocrystalline silicon or polycrystalline silicon. In another embodiment, the channel 310 may include amorphous silicon.

The source 380*a* and the drain 380*b* may be members formed through a low temperature process (a heat treatment process) performed at less than about 500° C. More specifically, the source 380*a* and the drain 380*b* may be formed through a process (a heat treatment process) of silicidating a previously-formed metal, wherein the process may be a low temperature process performed at less than about 500° C. For example, the source 380*a* and the drain 380*b* may be formed by silicidating at least one selected from a group consisting of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir). Accordingly, the source 380*a* and the drain 380*b* may include any silicide of at least one selected from a group consisting of tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir) as described above. Each of the source 380*a* and the drain 380*b* may respectively form a Schottky junction together with the channel 310 due to a difference in respective work functions with the channel 310. When the source 380*a* and the drain 380*b* are formed, an ion implantation process and a high temperature heat treatment (annealing) process (e.g., a high temperature process of about 1,000° C. or higher) may not be required.

At least one of the first and second insulating layers 320 and 340 may include, for example, at least one selected from a group consisting of silicon oxide, silicon nitride, silicon oxynitride, and a high-k dielectric material having a higher dielectric constant than silicon nitride (e.g., a dielectric constant greater than 7.5). The high-k dielectric material may be, for example, a metal oxide. However, the specific materials of the first and second insulating layers 320 and 340 disclosed herein are illustrative, and various other insulating materials may be applied.

The floating gate 330 may be a storage space for electric charges. The floating gate 330 may be referred to as a 'charge storage layer' or a 'charge trap layer'. For example, the floating gate 330 may include at least one selected from a group comprising a polycrystalline silicon layer, an amorphous silicon layer, a metal oxide layer, a silicon nitride layer, a silicon nanocrystal layer, a metal nanocrystal layer, a silicon oxide nanocrystal layer, and a metal oxide nanocrystal layer. Since the electrical weight of the synapse device S10 may vary according to the amount of charge stored in the floating gate 330, a synaptic operation may be possible.

The control gate 350 is an element for applying an electric field to the channel 310 and the insulating layers 320 and 340. For example, the control gate 350 may include at least one selected from a group comprising n-type polycrystalline silicon, p-type polycrystalline silicon, and a metallic material such as a metal, a metal alloy, or a metallic compound. For example, the metallic material may include aluminum (Al), molybdenum (Mo), chromium (Cr), palladium (Pd), platinum (Pt), nickel (Ni), titanium (Ti), gold (Au), tantalum (Ta), tungsten (W), silver (Ag), titanium nitride (TiN), and tantalum nitride (TaN), or any combination thereof, but may include other metallic materials.

The spacer insulating layer 360 may protect the sidewalls of the stack including the first insulating layer 320, the floating gate 330, the second insulating layer 340, and the control gate 350, may prevent a short circuit between these members or between an adjacent wiring and the members, may serve as a mask film for forming the source 380*a* and the drain 380*b*, or combinations thereof. The spacer insulating layer 360 may include, for example, at least one selected from a group comprising silicon oxide, silicon nitride, silicon oxynitride, and other insulating materials.

The vertical connection wiring 250 may be disposed in a contact hole H10 which is formed to penetrate the interlayer insulating layer 200 in its thickness direction. The vertical connection wiring 250 may be formed of silicon doped with conductive impurities or other various conductive materials (e.g., metallic materials). The silicon may be polycrystalline or amorphous, preferably polycrystalline. According to an embodiment, the vertical connection wiring 250 may be formed to electrically and mutually interconnect the source 380*a* of the synapse device S10, and the source region 120*a* of the lower device D10. Accordingly, the vertical connection wiring 250 may be in contact with/connected to an upper surface of the source region 120*a* and a lower surface of the source 380*a*. Therefore, the synapse device S10 and the lower device D10 may be electrically connected in an up-down direction (a vertical direction).

According to an embodiment, the synapse device S10 may have a Schottky barrier transistor structure which does not require an ion implantation process and does not require a high temperature heat treatment process (e.g., a high temperature process of about 1,000° C. or more). When the source 380*a* and the drain 380*b* of the synapse device S10 are formed, an ion implantation process and a high temperature heat treatment process may not be required. The source 380*a* and the drain 380*b* may be formed by using a silicidation process (a low temperature annealing process) using temperatures of about 500° C. or less, and the source 380*a* and the drain 380*b* thus formed may form respective Schottky junctions together with the channel 310. Since the synapse device S10 may be formed by a low-temperature process, when the synapse device S10 is formed, damage to or deterioration of the lower device D10 that may be caused by a high temperature may not occur. Therefore, according to an embodiment, it is possible to implement a neuromorphic device (a neuromorphic system) having three-dimensional integration (stacking). In the neuromorphic device according to the embodiment, the interconnecting length between the synapse device S10 and the lower device D10 may be minimized by arranging the interconnector vertically oriented, that is, by forming the interconnector as the vertical connection wiring 250, and characteristics and performance such as a degree of integration, power efficiency, and speed may be greatly improved.

In one embodiment, in the case of the Schottky barrier transistor, since the source and drain regions of the MOSFET are formed by a metal-based material rather than a p-n junction, an ion implantation process and a high-temperature heat treatment (annealing) process of 1,000° C. or more, which is normally required for activation of a dopant, are not required. Accordingly, when the synapse device S10 to which the configuration of the Schottky barrier transistor is applied is integrated (stacked) on the lower device D10, the lower device D10 may not be thermally deteriorated. As a result, a neuromorphic device having a three-dimensional stacked structure may be readily manufactured. By using the three-dimensional stacked structure, the interconnecting length between the synapse device S10 and the lower device D10 may be minimized, and the degree of integration, power efficiency, and speed of the neuromorphic system may be improved.

In one embodiment, when the first insulating layer 320 is positioned under the floating gate 330, injecting or removing charges into the floating gate 330 through the first insulating layer 320 may be based on Fowler-Nordheim (F-N) tunneling. In F-N tunneling, an electrical conductivity which changes according to an application of a gate voltage may have a logarithmic response. When a Schottky junction is formed between the channel 310 and the source 380*a* and the drain 380*b*, since an electrical conductivity in the corresponding Schottky tunneling region shows an exponential response according to the gate voltage, this may offset with logarithmic response of the F-N tunneling operation, so that high linearity and symmetry may be obtained in the synaptic operation. Therefore, the synapse operation characteristics of the synapse device S10 may be improved due to the Schottky junction described above. This will be described later in more detail with reference to FIG. 4.

In FIG. 1, although the structure of the synapse device S10 and the lower device D10 has been specifically illustrated and described, in some cases, the configuration of the synapse device S10 and the lower device D10 may be variously modified. For example, the channel 310 may have a three-dimensional shape in the form of a fin or a trench, and accordingly, the control gate 350 may have a structure surrounding the surface of the channel 310 having the three-dimensional shape. Alternatively, the control gate 350 may have a structure surrounding the channel 310 in the form of a nano-sheet. Alternatively, the control gate 350 may have a gate-all-around (GAA) structure completely (or substantially entirely) surrounding the channel 310. Alternatively, the control gate 350 may have a multiple-gate structure. For another example, although FIG. 1 might be interpreted as showing the respective footprints (that is, the area occupied when viewed looking down on the substrate) of the synapse device S10 and the lower device D10 completely overlapping, embodiments are not limited thereto, and in some case only a part or no part of the respective footprints of the synapse device S10 and the lower device D10 may overlap.

Figure 2:
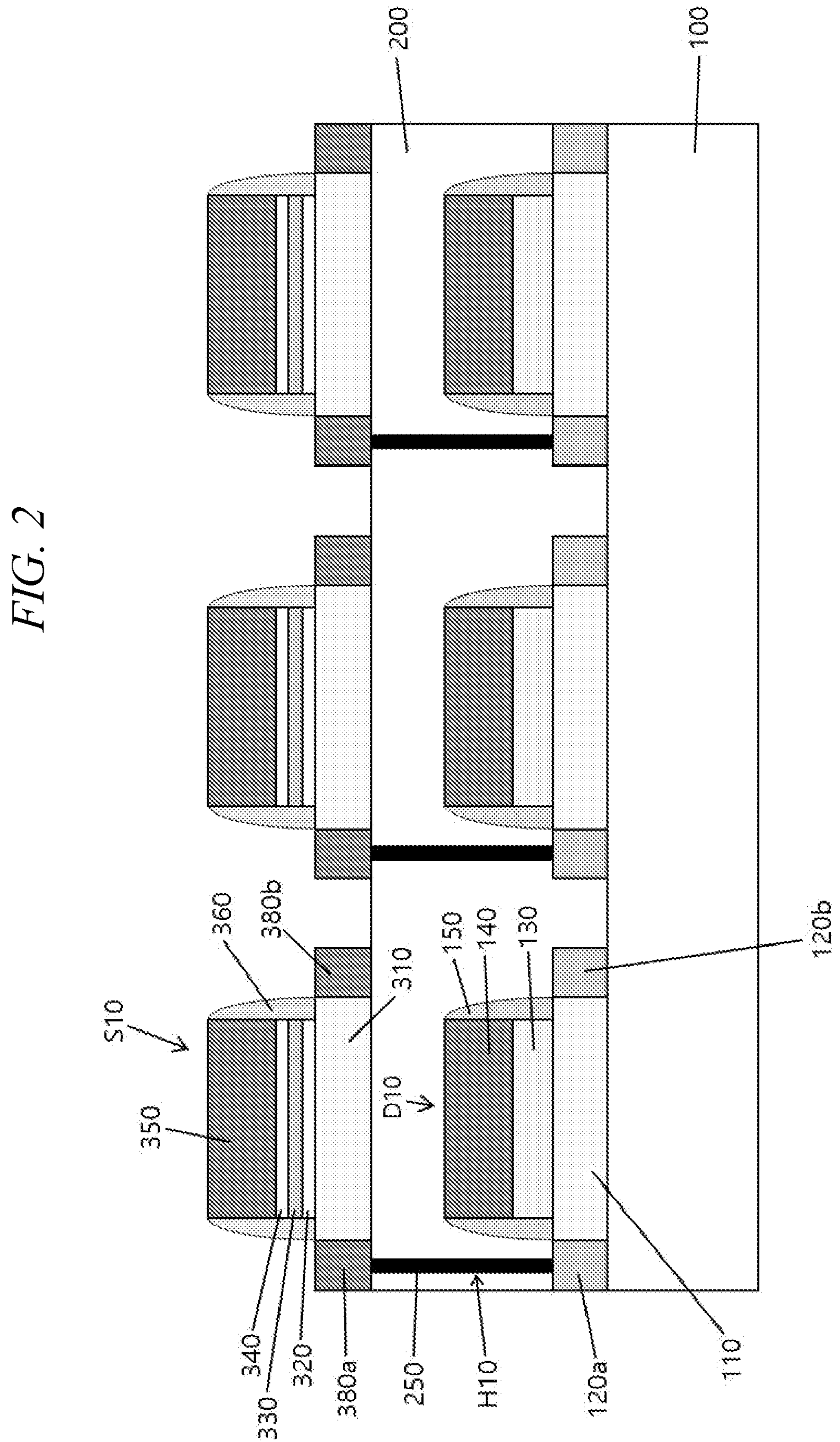
FIG. 2 is a cross-sectional diagram illustrating a neuromorphic device having a three-dimensional stacked structure according to another embodiment.

FIG. 2 is a cross-sectional diagram illustrating a neuromorphic device having a three-dimensional stacked structure according to another embodiment.

Referring to FIG. 2, a plurality of synapse devices S10 and a plurality of lower devices D10 having the structures shown in FIG. 1 may be arranged in an array form. The plurality of lower devices D10 each having a transistor structure are arranged to be spaced apart from each other. The plurality of synapse devices S10 may be arranged spaced apart from each other on the interlayer insulating layer 200. At least one of the plurality of synapse devices S10 may be electrically connected to at least one of the plurality of lower devices D10 by the vertical connection wire 250. Using the three-dimensional stacked structure, the interconnecting length between the synapse device S10 and the lower device D10 it is connected to may be minimized, and the degree of integration, power efficiency, speed, and etc. of the neuromorphic system may be improved. Each of the synapse devices S10 may be connected in a one-to-one relationship or a many-to-one relationship with a lower device D10.

FIG. 3A to FIG. 3K are cross-sectional diagrams illustrating a process for fabricating a neuromorphic device having a three-dimensional stacked structure according to an embodiment.

Figure 3A:
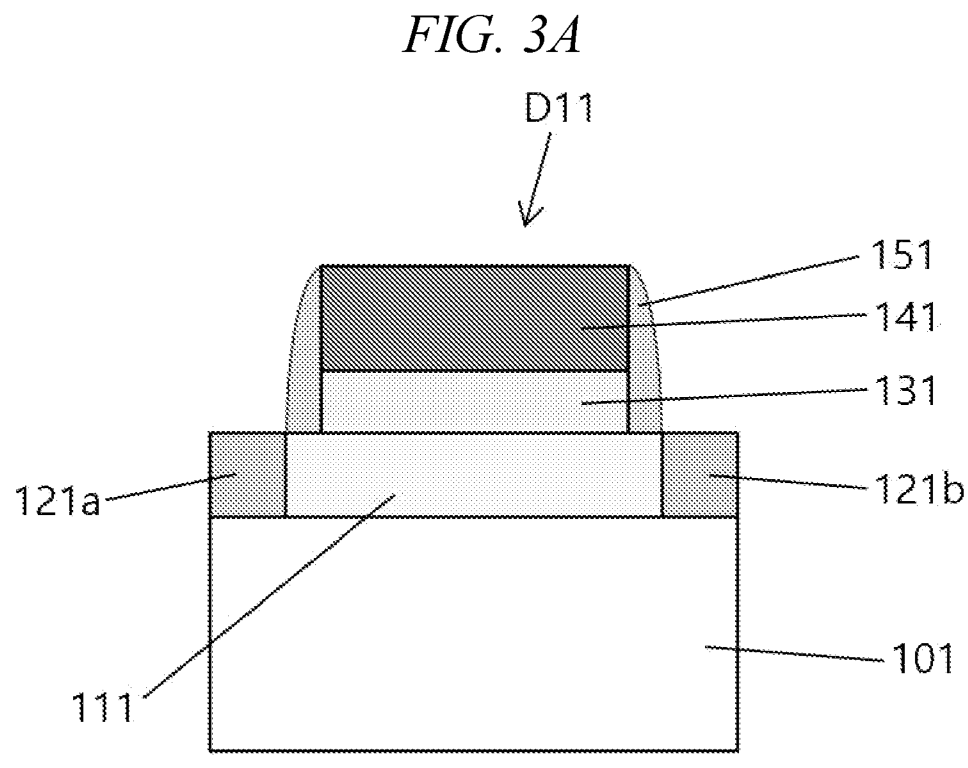
FIG. 3A to FIG. 3K are cross-sectional diagrams illustrating a process for fabricating a neuromorphic device having a three-dimensional stacked structure according to an embodiment.

Referring to FIG. 3A, a lower device D11 may be formed on a substrate 101. The substrate 101 may be a semiconductor substrate. For example, the substrate 101 may include any one selected from a group comprising silicon (Si), silicon germanium (SiGe), strained silicon (strained Si), strained silicon germanium (strained SiGe), silicon on insulator (SOI), silicon carbide (SiC), a group 3-5 compound semiconductor, and a group 2-7 compound semiconductor. However, the material of the substrate 101 is not limited to the above description, and various known structures may be used.

The lower device D11 may include a MOS device that is included in a neuron device, which neuron device may include an additional circuit or a peripheral circuit for signal processing and signal transmission. The lower device D11 may include a channel region 111, a source region 121*a*, a drain region 121*b*, a gate insulating layer 131, and a gate electrode 141. The channel region 111 may be referred to as a 'first channel'. The source region 121*a* may be referred to as a 'first source'. The drain region 121*b* may be referred to as a 'first drain'.

The channel region 111, the source region 121*a*, and the drain region 121*b* may include the same semiconductor material. For example, the channel region 111, the source region 121*a*, and the drain region 121*b* may include silicon (Si), silicon germanium (SiGe), strained silicon (strained Si), strained silicon germanium (strained SiGe), silicon carbide (SiC) or a group 3-5 compound semiconductor. The source region 121*a* and the drain region 121*b* may be the regions doped with a high concentration of conductive impurities.

Additionally, a sidewall insulating layer 151 may be further disposed on both side surfaces of a stack of the gate insulating layer 131 and the gate electrode 141. The sidewall insulating layer 151 may include, for example, silicon oxide, silicon nitride, silicon oxynitride, or other insulating materials. The sidewall insulating layer 151 may be referred to as a kind of spacer.

Figure 3B:
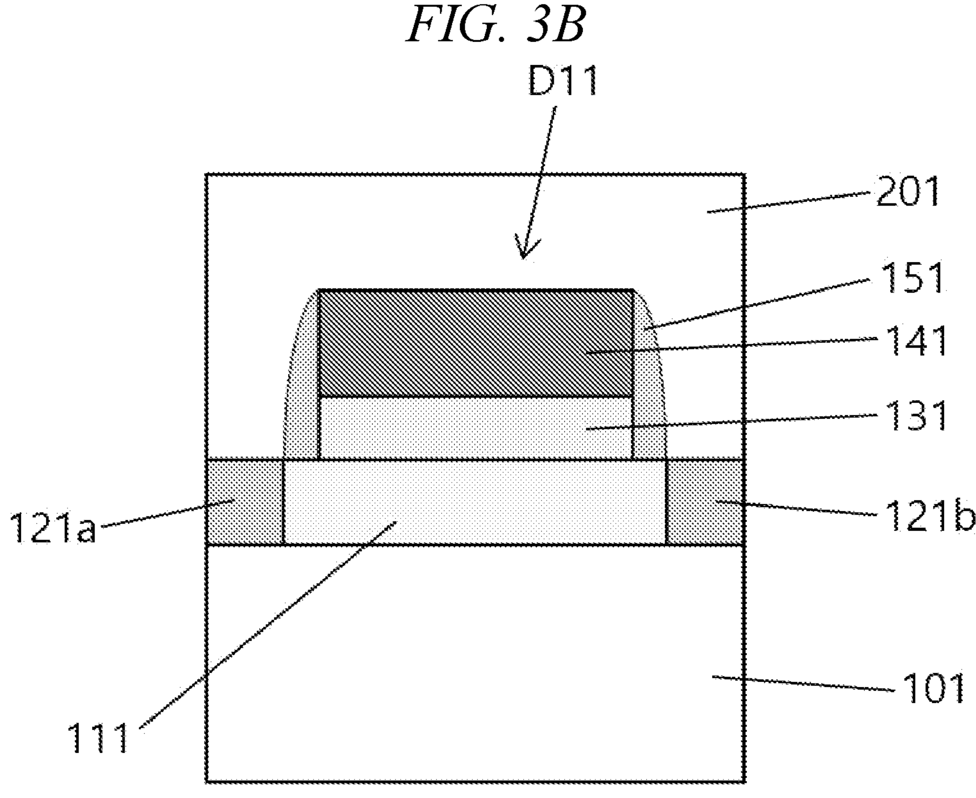

Referring to FIG. 3B, an interlayer insulating layer 201 covering the lower device D11 may be formed on the substrate 101. The interlayer insulating layer 201 may include, for example, at least one selected from a group comprising silicon oxide, silicon nitride, silicon oxynitride, and an insulating polymer. However, the material of the interlayer insulating layer 201 is not limited to the above materials, and various known materials may be applied.

Figure 3C:
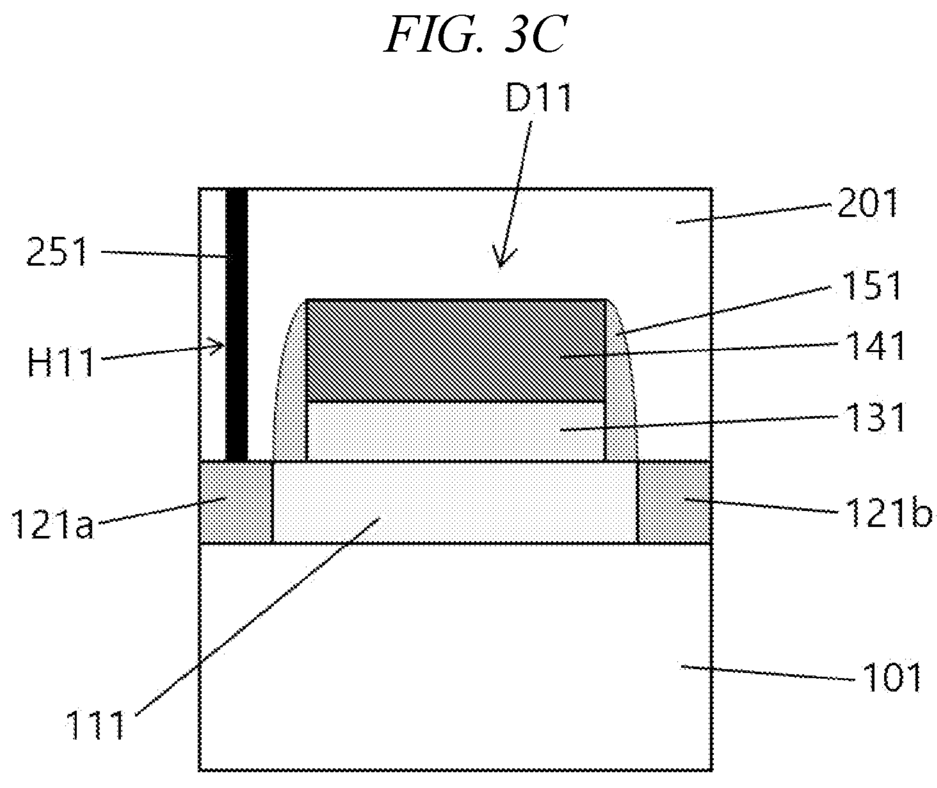

Referring to FIG. 3C, a vertical connection wiring 251 electrically connected to the lower device D11 may be formed in the interlayer insulating layer 201. The vertical connection wiring 251 may be disposed in a contact hole H11 formed to penetrate the interlayer insulating layer 201 in the thickness direction thereof. The vertical connection wiring 251 may be formed of silicon doped with conductive impurities or other various conductive materials (e.g., metallic materials).

Figure 3D:
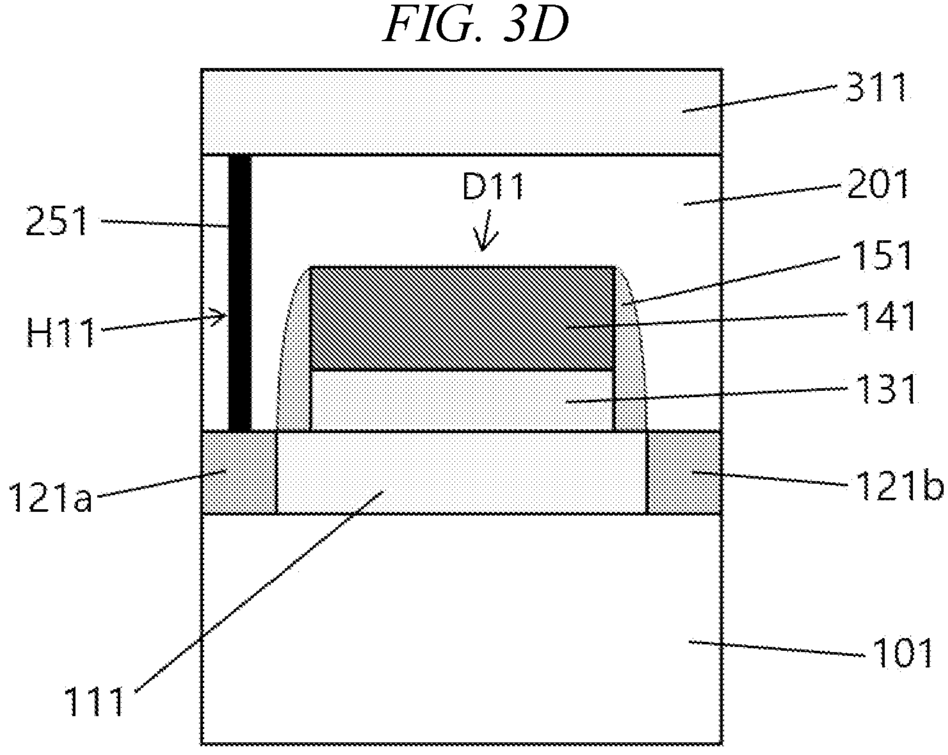

Referring to FIG. 3D, a channel material layer 311 may be formed on the interlayer insulating layer 201. The channel material layer 311 may include single crystal silicon or polycrystalline silicon, but in some cases, may include amorphous silicon. The channel material layer 311 may be formed by bonding single-crystal silicon to the interlayer insulating layer 201 or by depositing amorphous silicon on the interlayer insulating layer 201. When the amorphous silicon is deposited on the interlayer insulating layer 201, a heat treatment process for changing the phase of the amorphous silicon to a polycrystalline state may be performed. The heat treatment process may be performed at a relatively low temperature (for example, under 500 degrees C.) by using furnace annealing or laser annealing.

Figure 3E:
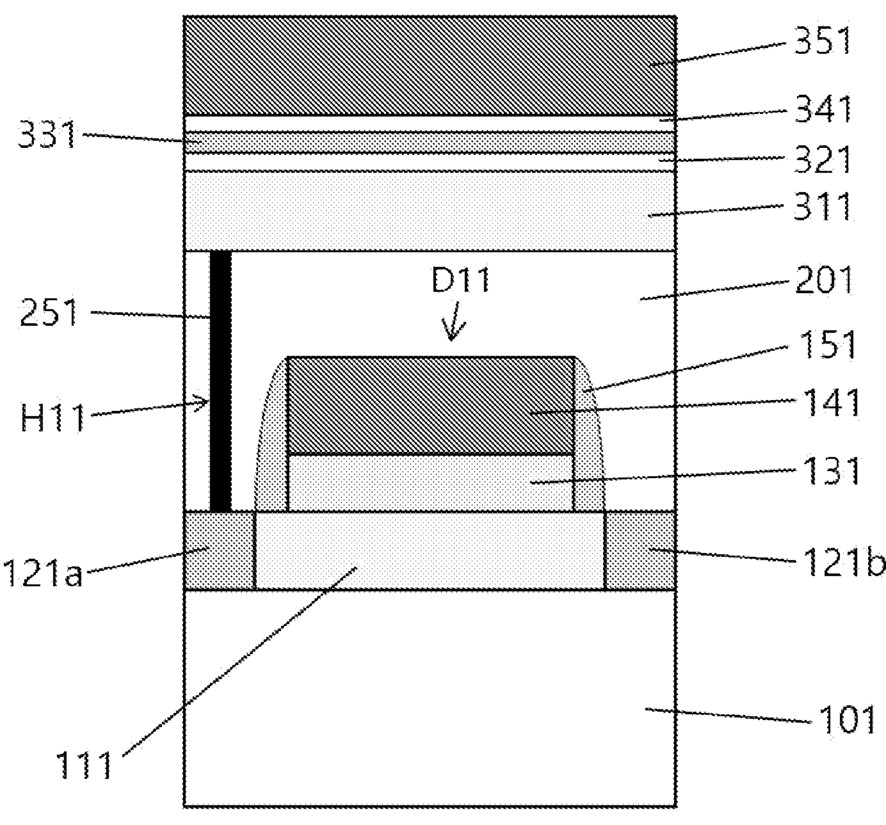

Referring to FIG. 3E, a floating gate material layer 331 and a control gate material layer 351 may be formed on the channel material layer 311. A first insulating material layer 321 may be further formed between the channel material layer 311 and the floating gate material layer 331, and a second insulating material layer 341 may be formed between the floating gate material layer 331 and the control gate material layer 351. Accordingly, the first insulating material layer 321, the floating gate material layer 331, the second insulating material layer 341, and the control gate material layer 351 may be sequentially formed on the channel material layer 311.

For example, at least one of the first and second insulating material layers 321 and 341 may include at least one selected from a group comprising silicon oxide, silicon nitride, silicon oxynitride, and high-k material having a higher dielectric constant than that of the silicon nitride (e.g., a dielectric constant greater than 7.5). However, the specific materials of the first and second insulating material layers 321 and 341 disclosed herein are illustrative, and various other insulating materials may be applied.

The floating gate material layer 331 may include a polycrystalline silicon layer, an amorphous silicon layer, a metal oxide layer, a silicon nitride layer, a silicon nanocrystal layer, a metal nanocrystal layer, a silicon oxide nanocrystal layer, a metal oxide nanocrystal layer, or combinations thereof, which are described as non-limiting examples. The control gate material layer 351 may include n-type polycrystalline silicon, p-type polycrystalline silicon, a metallic material (metal, metal compound), or combinations thereof, which are described as non-limiting examples. For example, the metallic material may include aluminum (Al), molybdenum (Mo), chromium (Cr), palladium (Pd), platinum (Pt), nickel (Ni), titanium (Ti), gold (Au), tantalum (Ta), tungsten (W), silver (Ag), titanium nitride (TiN), and tantalum nitride (TaN), or any combination thereof, but may include other metallic materials.

Figure 3F:
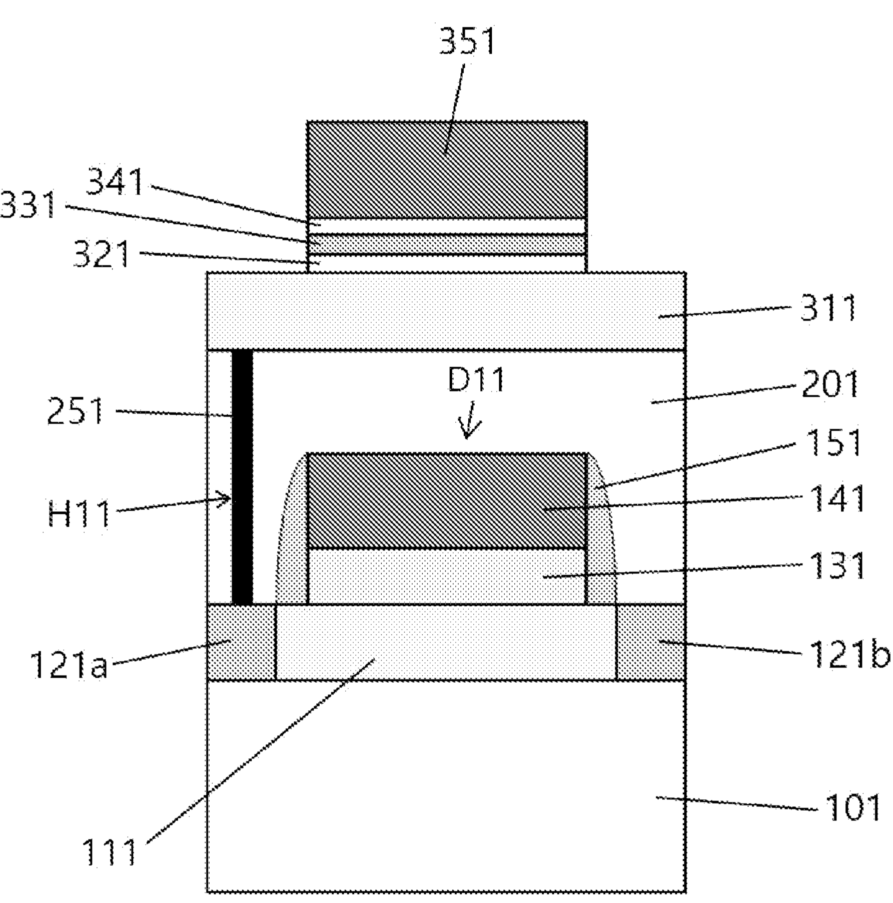

Referring to FIG. 3F, the control gate material layer 351, the second insulating material layer 341, the floating gate material layer 331, and the first insulating material layer 321 may be patterned according to a 'gate shape'. The control gate material layer 351, the second insulating material layer 341, the floating gate material layer 331, and the first insulating material layer 321 may be patterned through a lithography process including exposure and etching processes. The stacked structure consisting of the patterned control gate material layer 351, the second insulating material layer 341, the floating gate material layer 331, and the first insulating material layer 321 may be referred to as a 'gate stack'. Hereinafter, the patterned first insulating material layer 321 will be referred to as a first insulating layer 321, the patterned floating gate material layer 331 will be referred to as a floating gate 331, the patterned second insulating material layer will be referred to as a second insulating layer 341, and the patterned control gate material layer 351 will be referred to as a control gate 351.

Figure 3G:
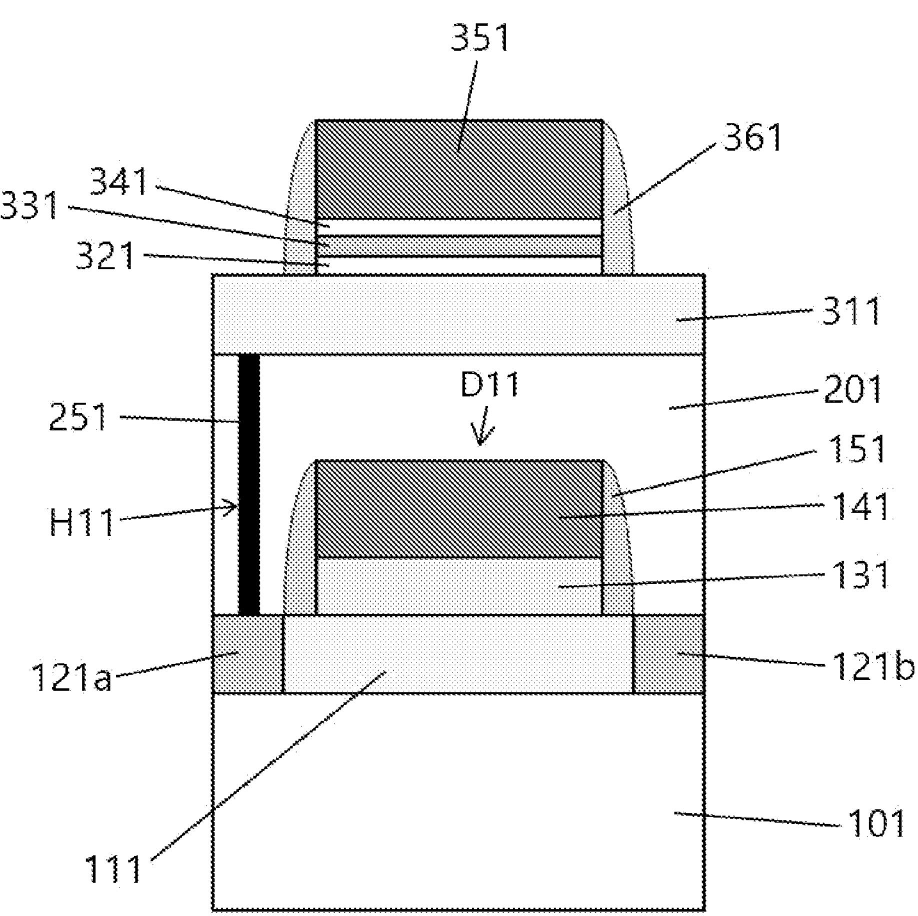

Referring to FIG. 3G, a spacer insulating layer 361 may be formed on first and second side surfaces of the structure in which the first insulating layer 321, the floating gate 331, the second insulating layer 341, and the control gate 351 are stacked. The spacer insulating layer 361 may play a role to prevent problems such as short circuit and so on while protecting the sidewalls of the structure (stack) in which the first insulating layer 321, the floating gate 331, the second insulating layer 341, and the control gate 351 are stacked. For example, the spacer 361 may include at least one selected from a group comprising of silicon oxide, silicon nitride, silicon oxynitride, and other insulating materials. The first insulating layer 321, the floating gate 331, the second insulating layer 341, the control gate 351, and the spacer 361 may be regarded as constituting a 'gate stack'.

Figure 3H:
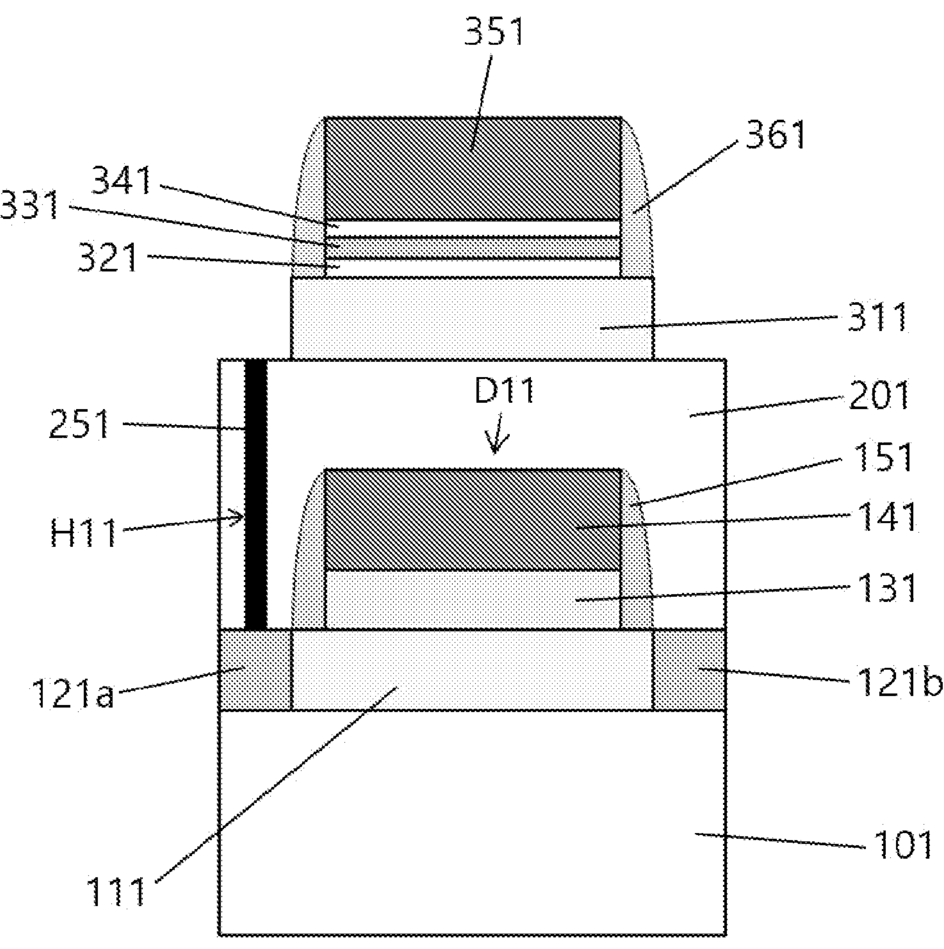

Referring to FIG. 3H, portions of the channel material layer 311 on both sides of a structure (gate stack) including the first insulating layer 321, the floating gate 331, the second insulating layer 341, the control gate 351, and the spacer 361 may be removed by etching. As described above, a 'channel' may be defined from the channel material layer 311 by patterning the channel material layer 311. Hereinafter, the patterned channel material layer 311 is referred to as a channel 311.

Figure 3I:
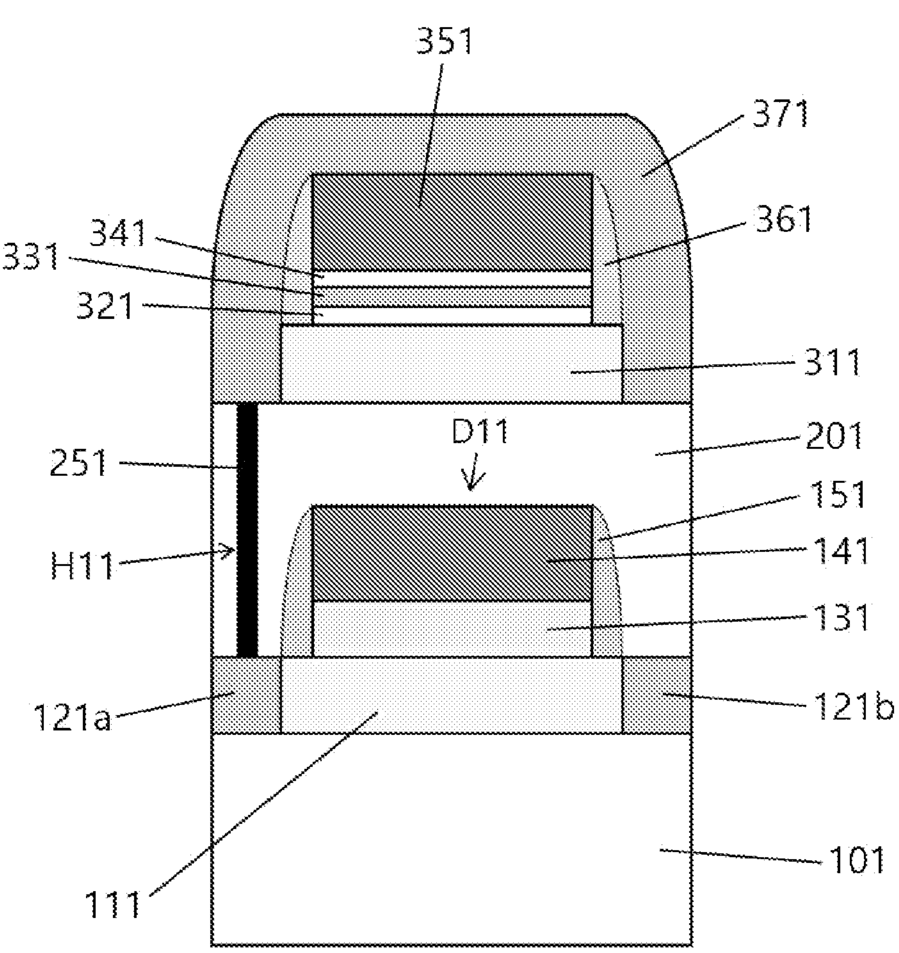

Referring to FIG. 3I, a metal layer 371 covering the control gate 351 while being bonded to first and second side surfaces of the channel 311 may be formed. For example, the metal layer 371 may be formed to include at least any one selected from a group comprising tungsten (W), titanium (Ti), cobalt (Co), nickel (Ni), erbium (Er), ytterbium (Yb), samarium (Sm), yttrium (Y), gadolinium (Gd), terbium (Tb), cerium (Ce), platinum (Pt), and iridium (Ir). The spacer insulating layer 361 may serve to electrically separate the metal layer 371 from both side surfaces of the first insulating layer 321, the floating gate 331, the second insulating layer 341, and the control gate 351.

Figure 3J:
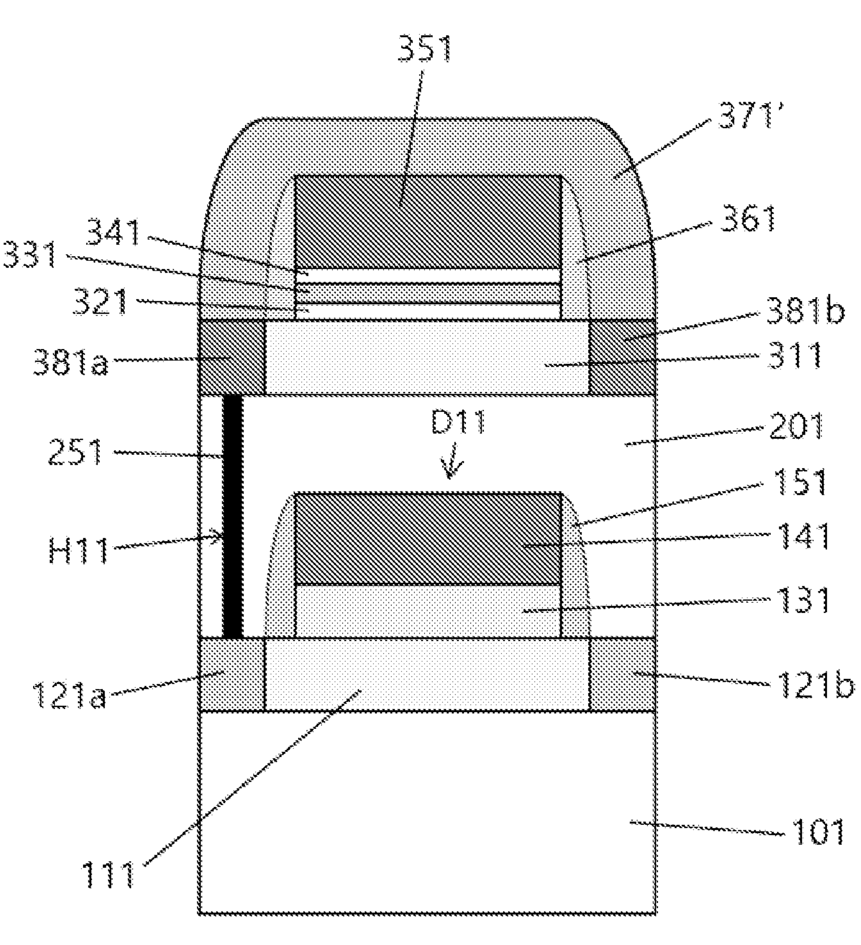

Referring to FIG. 3J, by performing a heat treatment process (thermal treatment process) on the metal layer 371 to change the portions of the metal layer 371 bonded to both side surfaces of the channel 311 to a metal silicide by a reaction between side portions of the channel 311 and the metal layer 371, a source 381*a* and a drain 381*b* may be formed. The heat treatment process may be performed at a temperature of less than about 500° C. The heat treatment process may be performed by any one of rapid thermal annealing (RTA), furnace annealing, and laser annealing. As an illustrative example, the metal layer 371 may be formed of nickel (Ni) and be heat-treated at a temperature in the range of about 400 to 500° C. by using an RTA process. Therefore, the source 381*a* and the drain 381*b* containing nickel silicide may be formed. Since the source 381*a* and the drain 381*b* may be formed by a low-temperature heat treatment process of less than about 500° C., the lower device D11 may not be damaged or deteriorated when the source 381*a* and the drain 381*b* are formed. Accordingly, a neuromorphic device having a three-dimensional stacked structure may be manufactured.

The source 381*a* and the drain 381*b* may form respective Schottky junctions with the channel 311. Each of the source 381*a* and the drain 381*b* may include a region comprising metal silicide (a metal silicide region) bonded to the channel 311, and at the same time, may also include a region comprising metal (a metal region) that is not in direct physical contact with the channel 311.

In addition, any one of the source 381*a* and the drain 381*b*, for example, the source 381*a*, may be electrically contacted/connected to the vertical connection wiring 251. Accordingly, the source 381*a* may be electrically connected to the source region 121*a* of the lower device D11. The vertical connection wiring 251 may be disposed directly on the source region 121*a*, and the source 381*a* may be disposed directly on the vertical connection wiring 251. Meanwhile, the reference numeral 371' in FIG. 3J denotes an unreacted metal layer which is not silicided by the heat treatment process.

Figure 3K:
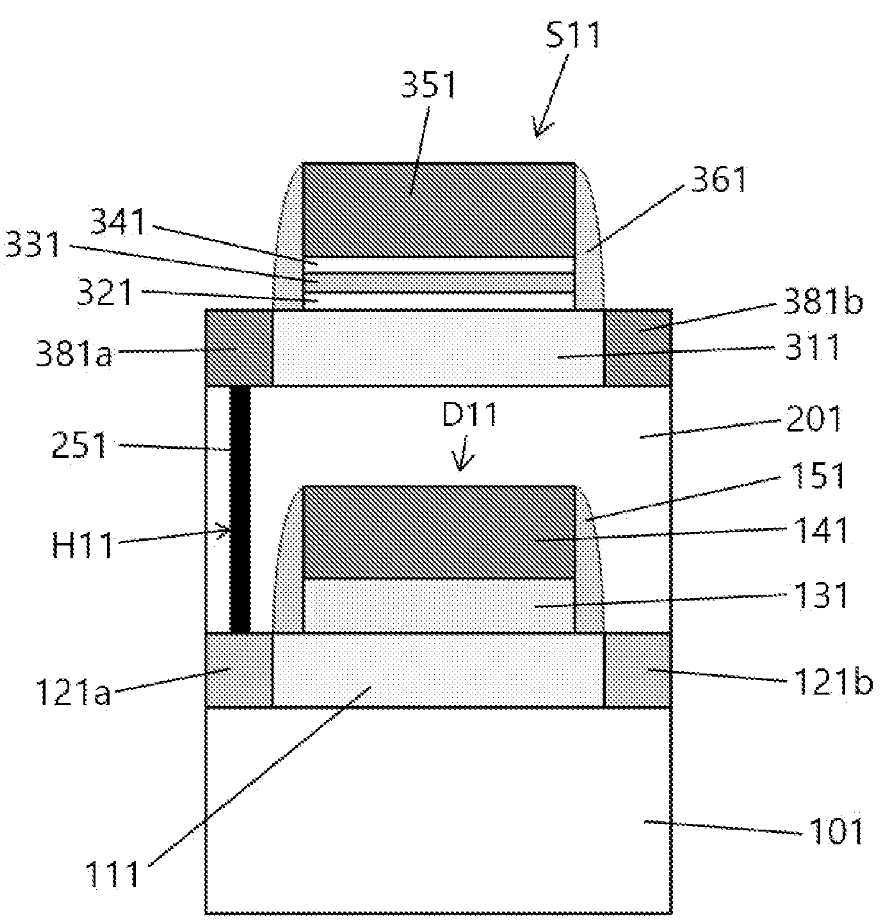

Referring to FIG. 3K, the unreacted metal layer 371' which has not reacted in the heat treatment process of FIG. 3J may be removed. The unreacted metal layer 371' may be removed by a wet etching process or a dry etching process. When using the wet etching process, the unreacted metal layer 371' may be selectively etched and then removed by using aqua regia in which hydrochloric acid (HCl) and nitric acid ($HNO_3$) are mixed, or sulfuric peroxide mixture (SPM) solution in which sulfuric acid ($H_2SO_4$) and hydrogen peroxide ($H_2O_2$) are mixed. When the dry etching process is used, the unreacted metal layer 371' may be etched (removed) by using a sputtering process using argon (Ar) gas. However, the process for removing the unreacted metal layer 371' is not limited to the above-mentioned process, and may be variously changed.

The reference number S11 in FIG. 3K represents a synapse device. The synapse device S11 may have a Schottky barrier transistor structure including the channel 311, the source 381*a*, and the drain 381*b*, wherein each of the source 381*a*, and the drain 381*b* contain a metal silicide that forms a Schottky junction with the channel 311. The synapse device S11 may further include the floating gate 311 for a synaptic operation, and the control gate 351. The lower device D11 and the synapse device S11 may be electrically interconnected in the vertical direction by the vertical connection wiring 251.

In FIG. 3A to FIG. 3K, a process for fabricating a neuromorphic device according to an embodiment has been specifically illustrated and described, but this is merely illustrative and may be variously changed according to circumstances.

Figure 4:
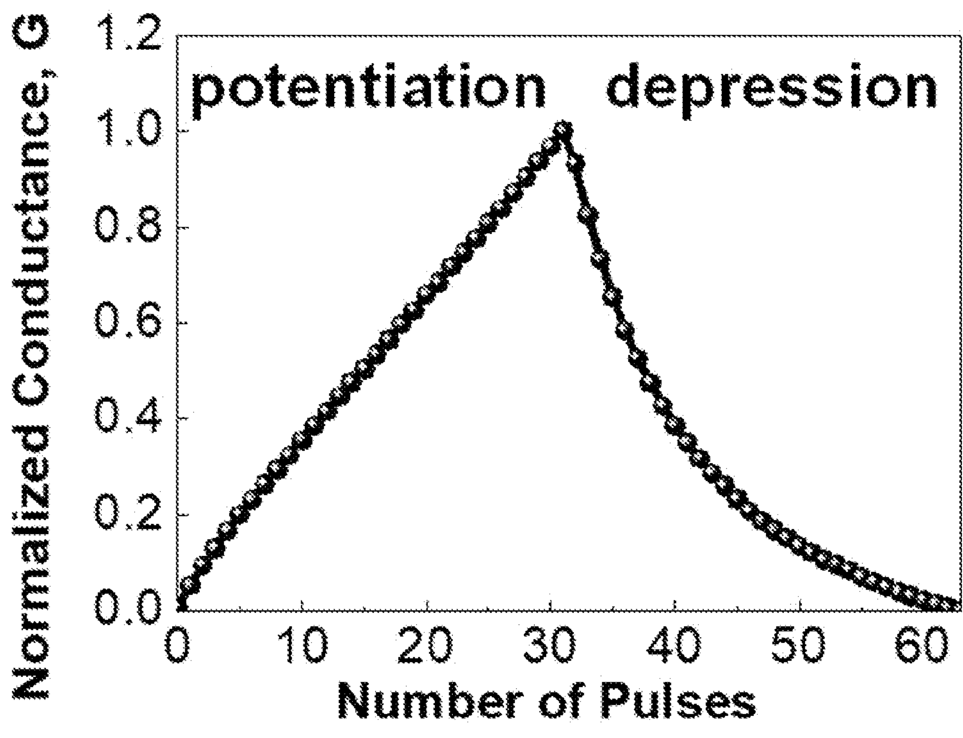
FIG. 4 is a graph illustrating a result of evaluating synaptic characteristics of a synapse device which may be applied to a neuromorphic device having a three-dimensional stacked structure according to an embodiment.

FIG. 4 is a graph illustrating a result of evaluating synaptic characteristics of a synapse device which may be applied to a neuromorphic device having a three-dimensional stacked structure according to an embodiment. Here, the synapse device is an n-channel device having a Schottky junction.

Referring to FIG. 4, it may be seen that the synapse device exhibits excellent synaptic operation characteristics. A potentiation operation in which electrical conductivity and weight are increased may be possible by applying a negative (−) voltage to the gate (control gate) to remove charges (electrons) stored in the floating gate. A depression operation in which electrical conductivity and weight are reduced may be possible by applying a positive (+) voltage to the gate (control gate) to inject charges (electrons) into the floating gate. If the synapse device has a p-channel, that is, if the synapse device is a p-channel device, the sign of the voltage applied to the gate (control gate) may be reversed in potentiation and suppression operations.

In an embodiment, when an insulating material (i.e., the first insulating layer) is located under the floating gate, the principle for injecting or removing charges into the floating gate through the insulating material may be Fowler-Nordheim (F-N) tunneling. At this time, an electrical conductivity that changes according to an application of the gate voltage may show a logarithmic response according to a number of input signals. When a Schottky junction is formed between the channel and the source and drain, an electrical conductivity in the corresponding Schottky tunneling region has an exponential response according to the gate voltage, it may be offset together with the logarithmic response caused by the F-N tunneling operation, so that high linearity and symmetry may be obtained in the synaptic operation. Therefore, the synaptic operation characteristics of the synapse device may be improved due to the above-described Schottky junction.

As demonstrated by the embodiments described above, it is possible to implement a neuromorphic device capable of three-dimensional integration by using a Schottky barrier transistor that does not require an ion implantation process or a high temperature heat treatment (annealing) process of about 1,000° C. or more. Accordingly, in the neuromorphic device, the interconnecting length among the synapse device, the neuron device, and any additional circuits may be minimized, and characteristics and performance such as integration degree, power efficiency, and speed may be greatly improved. In the case of the Schottky barrier transistor, since the source/drain regions of the MOSFET are formed of a metal-based material rather than a p-n junction, an ion implantation process and a high-temperature heat treatment (annealing) process at 1,000° C. or higher may not be required. Therefore, when the synapse device to which the configuration of the Schottky barrier transistor is applied is integrated (stacked) on a previously-fabricated lower device, the lower device may not be deteriorated. As a result, a neuromorphic device having a three-dimensional stacked structure may be readily manufactured. In addition, by using the three-dimensional stacked structure, the interconnecting length among the synaptic element, the neuron element, and the additional circuit may be minimized, and the degree of integration, power efficiency, and speed of the neuromorphic system may be improved. Therefore, it is possible to implement a neuromorphic device (system) capable of high-speed operation with high integration and low power consumption characteristics.

In the present specification, illustrative embodiments have been disclosed, and although specific terms are used, these are only used in a general sense to easily describe the technical content of the embodiments and to help the understanding of the present invention, and are not necessarily meant to limit the scope of the present invention. It will be apparent to those having common knowledge in the related art to which the present invention pertains that other modifications based on the technical spirit of the present disclosure may be implemented in addition to the embodiments disclosed herein. Those having common knowledge in the related art will understand that various substitutions, changes and modifications may be made without departing from the technological concepts disclosed in connection with neuromorphic devices having a three-dimensional stacked structure and processes for fabricating the same according to the embodiments described with reference to FIGS. 1 to 4. For example, the shape/structure of the lower device may be variously changed, and the vertical connection wiring may have a bent structure (curved structure) instead of a linear structure. Therefore, the scope of the invention should not be determined by the described embodiments, but should be determined by the accompanying claims.

[Explanation of Symbols]
* Explanation of symbols for the main parts of the drawing *

100: substrate
110: channel region
120a: source region
120b: drain region
130: gate insulating layer
140: gate electrode
150: side wall insulating layer
200: interlayer insulating layer
250: vertical connection wiring
310: channel
320: first insulating layer
330: floating gate
340: second insulating layer
350: control gate
360: spacer
380a: source
380b: drain
D10: lower device
H10: contact hole
S10: synaptic element

What is claimed is:

1. A neuromorphic device comprising:

a neuron device formed on a substrate;

an interlayer insulating layer formed on the substrate to cover the neuron device;

a synapse device having a Schottky barrier transistor structure and vertically aligned with the neuron device, the synapse device having a Schottky barrier transistor structure and including a channel, a floating gate, a control gate for a synaptic operation, a source having a first Schottky junction with the channel, and a drain having a second Schottky junction with the channel; and a vertical connection wiring formed in the interlayer insulating layer to electrically connect the neuron device and the synapse device, wherein the neuron device includes a transistor device, the transistor device including a channel region, a source region, a drain region, a gate insulating layer, and a gate electrode, and the vertical connection wiring is configured to electrically interconnect the source of the synapse device and the source region of the transistor device and the drain of the synapse device and the drain region of the transistor device are not electrically connected to each other.

2. The neuromorphic device of claim 1, wherein the first Schottky junction comprises a metal silicide formed between a first side surface of the channel and a metal constituting the source through a low temperature process, wherein the second Schottky junction comprises a metal silicide formed between a second side surface of the channel and a metal constituting the drain through the low temperature process, and wherein the low temperature process is performed at less than 500° C.

3. The neuromorphic device of claim 1, wherein the source and drain each include a silicide of at least one selected from a group consisting of tungsten, titanium, cobalt, nickel, erbium, ytterbium, samarium, yttrium, gadolinium, terbium, cerium, platinum, and iridium.

4. The neuromorphic device of claim 1, wherein the channel of the synapse device includes silicon.

5. The neuromorphic device of claim 1, wherein the synapse device further includes a first insulating layer disposed between the channel and the floating gate and a second insulating layer disposed between the floating gate and the control gate, and at least one of the first and second insulating layers includes at least one selected from a group consisting of a silicon oxide, a silicon nitride, a silicon oxynitride, and a high-k material having a dielectric constant greater than 7.5.

6. The neuromorphic device of claim 1, wherein the floating gate of the synapse device includes a polycrystalline silicon layer, an amorphous silicon layer, a metal oxide layer, a silicon nitride layer, a silicon nanocrystal layer, a metal nanocrystal layer, a silicon oxide nanocrystal layer, a metal oxide nanocrystal layer, or a combination thereof.

7. The neuromorphic device of claim 1, wherein the synaptic operation includes inducing Fowler-Nordheim (F-N) tunnelling by applying a voltage to the floating gate so that a charge amount corresponding to an electrical conductivity is stored, and the electrical conductivity exhibits an exponential response due to the Schottky junction and exhibits a logarithmic response due to the F-N tunnelling, such that the two responses offset each other.

8. The neuromorphic device of claim 1, wherein a footprint of the synapse device overlaps a footprint of the neuron device.

9. A method of fabricating a neuromorphic device, comprising:

forming a neuron device on a substrate;

forming an interlayer insulating layer on the substrate to cover the neuron device;

forming a vertical connection wiring electrically connected to the neuron device in the interlayer insulating layer; and forming a synapse device having a Schottky barrier transistor structure, vertically aligned with the neuron device on the interlayer insulating layer and electrically connected to the vertical connection wiring, the synapse device including a channel, a floating gate for a synaptic operation, a control gate, a source having a first Schottky junction with the channel, and a drain having a second Schottky junction with the channel, wherein the neuron device includes a transistor device, the transistor device including a channel region, a source region, a drain region, a gate insulating layer, and a gate electrode, and the vertical connection wiring is configured to electrically interconnect the source of the synapse device and the source region of the transistor device and the drain of the synapse device and the drain region of the transistor device are not electrically connected to each other.

10. The method of fabricating a neuromorphic device of claim 9, wherein the forming of the synapse device includes:

forming a metal layer bonded to first and second side surfaces of the channel; and forming the first and second Schottky junctions by performing a heat treatment process to change portions of the metal layer adjoining the first and second side surfaces of the channel into a metal silicide.

11. The method of fabricating a neuromorphic device of claim 10, wherein the forming of the synapse device includes:

after forming the first and second Schottky junctions, removing a portion of the metal layer which has not been changed into the metal silicide.

12. The method of fabricating a neuromorphic device of claim 10, wherein the heat treatment process is performed at a temperature of less than 500° C.

13. The method of fabricating a neuromorphic device of claim 10, wherein the heat treatment process is performed using rapid thermal annealing (RTA), furnace annealing, laser annealing, or a combination thereof.

14. The method of fabricating a neuromorphic device having a three-dimensional stacked structure of claim 10, wherein the metal layer includes at least one selected from a group consisting of tungsten, titanium, cobalt, nickel, erbium, ytterbium, samarium, yttrium, gadolinium, terbium, cerium, platinum, and iridium.

15. The method of fabricating a neuromorphic device of claim 10, wherein, before the forming of the metal layer, the forming of the synapse device further includes:

forming a channel material layer on the interlayer insulating layer;

forming a gate stack including the floating gate and the control gate on the channel material layer; and forming the channel from the channel material layer by etching portions of the channel material layer on first and second sides of the gate stack.

16. The method of fabricating a neuromorphic device of claim 9, wherein the synaptic operation includes inducing Fowler-Nordheim (F-N) tunnelling by applying a voltage to the floating gate so that a charge amount corresponding to an electrical conductivity is stored, and the electrical conductivity exhibits an exponential response due to the Schottky junction and exhibits a logarithmic response due to the F-N tunnelling, such that the two responses offset each other.

17. The method of fabricating a neuromorphic device of claim 9, wherein a footprint of the synapse device overlaps a footprint of the neuron device.

* * * * *